United States Patent
Yasumoto et al.

(10) Patent No.: US 8,018,107 B2
(45) Date of Patent: Sep. 13, 2011

(54) BRUSHLESS MOTOR HAVING A SUBSTANTIALLY FLAT ATTACHMENT PLATE AND A CIRCUIT BOARD, AND DISK DRIVE APPARATUS PROVIDED WITH THE SAME

(75) Inventors: Nobuaki Yasumoto, Kyoto (JP); Hitoshi Takaki, Kyoto (JP); Masahiro Yamada, Kyoto (JP); Yosuke Kawano, Kyoto (JP)

(73) Assignee: Nidec Corporation, Kyoto (JP)

( * ) Notice: Subject to any disclaimer, the term of this patent is extended or adjusted under 35 U.S.C. 154(b) by 295 days.

(21) Appl. No.: 12/416,214

(22) Filed: Apr. 1, 2009

(65) Prior Publication Data
US 2009/0252015 A1    Oct. 8, 2009

(30) Foreign Application Priority Data

Apr. 2, 2008    (JP) .................................. 2008-096084

(51) Int. Cl.
*H02K 5/04*    (2006.01)
*H02K 5/00*    (2006.01)

(52) U.S. Cl. ................. 310/91; 310/66; 310/85; 310/89; 310/40 MM (58) Field of Classification Search .................... 310/66, 310/85, 89, 91, 40 MM; *H02K 5/00, 5/04*
See application file for complete search history.

(56) References Cited

U.S. PATENT DOCUMENTS

| | | | | |
|---|---|---|---|---|
| 5,352,947 A | * | 10/1994 | MacLeod | 310/67 R |
| 5,548,458 A | * | 8/1996 | Pelstring et al. | 360/99.08 |
| 5,754,022 A | * | 5/1998 | Uehara et al. | 318/474 |
| 6,320,824 B1 | * | 11/2001 | Hirata | 369/53.29 |
| 2003/0094869 A1 | * | 5/2003 | Ameen et al. | 310/90 |
| 2007/0278880 A1 | | 12/2007 | Wada et al. | |
| 2008/0030109 A1 | * | 2/2008 | Takaki et al. | 360/99.08 |

FOREIGN PATENT DOCUMENTS

| | | |
|---|---|---|
| JP | 2005-253239 A | 9/2005 |
| JP | 2007-012199 A | 1/2007 |
| JP | 2007-200376 A | 8/2007 |
| JP | 2007-207372 A | 8/2007 |
| JP | 2007-280509 A | 10/2007 |

* cited by examiner

*Primary Examiner* — Quyen Leung
*Assistant Examiner* — Michael Andrews
(74) *Attorney, Agent, or Firm* — Westerman, Hattori, Daniels & Adrian, LLP (57) ABSTRACT

A brushless motor includes a substantially flat attachment plate and a circuit board. The attachment plate includes a plurality of motor attachment portions and a base portion arranged to interconnect the motor attachment portions. The circuit board is arranged on an upper surface of the base portion and includes a first area to which electronic parts are attached. The upper surfaces of the motor attachment portions are arranged higher than the upper surface of the base portion. The height of the upper surface of the circuit board in the first area is substantially equal to or greater than the height of the upper surfaces of the motor attachment portions.

10 Claims, 9 Drawing Sheets

Section A-A

Secton D-D

Section C-C

Section A-A

FIG.8C

Section B-B

BRUSHLESS MOTOR HAVING A SUBSTANTIALLY FLAT ATTACHMENT PLATE AND A CIRCUIT BOARD, AND DISK DRIVE APPARATUS PROVIDED WITH THE SAME

BACKGROUND OF THE INVENTION

1. Field of the Invention

The present invention relates to a motor mounted to a disk drive apparatus and, more particularly, to a motor including a circuit board with electronic parts attached thereto.

2. Description of the Related Art

In recent years, the reduction in the overall thickness of portable devices leads to an increasing demand for a low-profile disk drive apparatus mounted to the portable devices. In order to provide the low-profile disk drive apparatus, it is necessary to reduce the overall thickness of a traverse unit. The traverse unit includes an optical pickup mechanism arranged to emit and receive light to and from a disk, a motor arranged to rotate the disk and a chassis arranged to support the optical pickup mechanism and the motor. The motor is fixed to the chassis by using, e.g., screws. One example of this configuration is disclosed in Japanese Patent Laid-open Publication No. 2007-280509.

In case the motor is fixed to the chassis with screws, the heads of screws protrude beyond the lower surface of an attachment plate. This makes it difficult to reduce the overall thickness of the traverse unit.

In view of this, there has been proposed a method in which a space for accommodating screw heads is defined by forming the screw attachment portions of an attachment plate of a motor higher than the remaining portion of the attachment plate. One example of the configuration using this method is disclosed in Japanese Patent Laid-open Publication No. 2005-253239.

A circuit board is attached to the upper surface of the attachment plate of the motor. The end portions of coils of a stator included in the motor are connected to the circuit board. In case electronic parts are bonded to the circuit board by soldering, the task of attaching the circuit board to the attachment plate precedes the task of bonding the electronic parts to the circuit board. This is to secure positional accuracy of the electronic parts. When bonding the electronic parts to the circuit board, soldering is preliminarily performed on the portions to which the electronic parts are to be bonded.

As mentioned above, the screw attachment portions of the attachment plate of the motor are formed higher than the remaining portion of the attachment plate with a view to reduce the overall thickness of the traverse unit. For that reason, the upper surfaces of the screw attachment portions are positioned higher than the upper surface of the circuit board. As a result, it is impossible for a mounting unit to carry out the task of preliminarily performing soldering on the circuit board. Therefore, the task of preliminarily performing soldering on the circuit board needs to be manually carried out by a worker. This sharply reduces the motor production efficiency.

SUMMARY OF THE INVENTION

A brushless motor in accordance with one preferred embodiment of the present invention is rotatable about a central axis. The brushless motor includes a substantially flat attachment plate and a circuit board. The attachment plate includes a plurality of motor attachment portions and a base portion arranged to interconnect the motor attachment portions. The circuit board is arranged on an upper surface of the base portion and includes a first area to which electronic parts are attached.

The upper surfaces of the motor attachment portions are arranged higher than the upper surface of the base portion. The height of the upper surface of the circuit board in the first area is substantially equal to or greater than the height of the upper surfaces of the motor attachment portions.

With the brushless motor in accordance with one preferred embodiment of the present invention, it is possible to reduce the overall thickness of the brushless motor using the circuit board to which electronic parts are attached.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

In the description made herein, the terms "upper", "lower", "left" and "right" used in explaining the positional relationship and orientation of individual members are intended to designate the positional relationship and orientation in the drawings and not to designate the positional relationship and orientation when built in an actual device.

Figure 1:
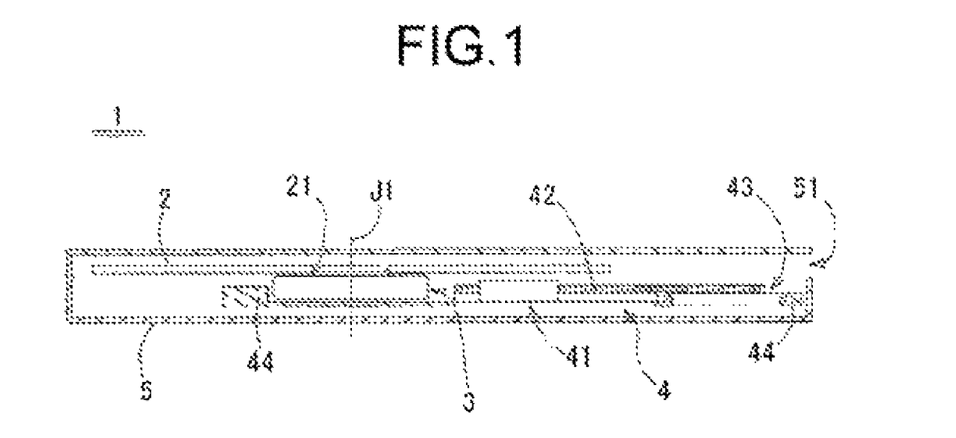
FIG. 1 is a section view showing a disk drive apparatus in accordance with the present invention, which view is taken along a plane containing a central axis.

One preferred embodiment of a disk drive apparatus of the present invention will be described with reference to FIG. 1. FIG. 1 is a section view showing the disk drive apparatus in accordance with the present preferred embodiment, which view is taken along a plane containing a central axis.

Referring to FIG. 1, the disk drive apparatus 1 preferably includes a brushless motor 3 (sometimes simply referred to as "motor" herein below), an optical pickup unit 41, a pair of guide rails 42, a moving mechanism 43, a chassis 44 and a housing 5.

The brushless motor 3 rotates a disk 2 about a specified central axis J1. The optical pickup unit 41 is movable relative to the motor 3 in a direction perpendicular to the central axis J1. The guide rails 42 assists in moving the optical pickup unit 41. The moving mechanism 43 moves the optical pickup unit 41 in the radial direction. The brushless motor 3, the guide rails 42 (see FIG. 2) and the moving mechanism 43 are fixed to the chassis 44. The optical pickup unit 41 is accommodated within the chassis 44. Hereinafter, the component parts fixed to the chassis 44 will be referred to as a traverse unit 4. The housing 5 has a substantially rectangular opening 51 through which to load and unload the disk 2.

The optical pickup unit 41 preferably includes a light-emitting portion arranged to emit light toward a recording surface of the disk 2 and a light-receiving portion arranged to receive the light reflected from the recording surface of the disk 2.

When the disk 2 loaded through the opening 51 is moved to a position substantially coaxial with the central axis J1 of the motor 3, the chassis 44 moves upwards to have the disk 2 mounted on the motor 3. When the disk 2 is unloaded after the completion of recording or reproducing operation, the chassis 44 moves downwards to have the disk 2 removed from the motor 3. Then the disk 2 is discharged through the opening 51 of the housing 5.

Figure 2:
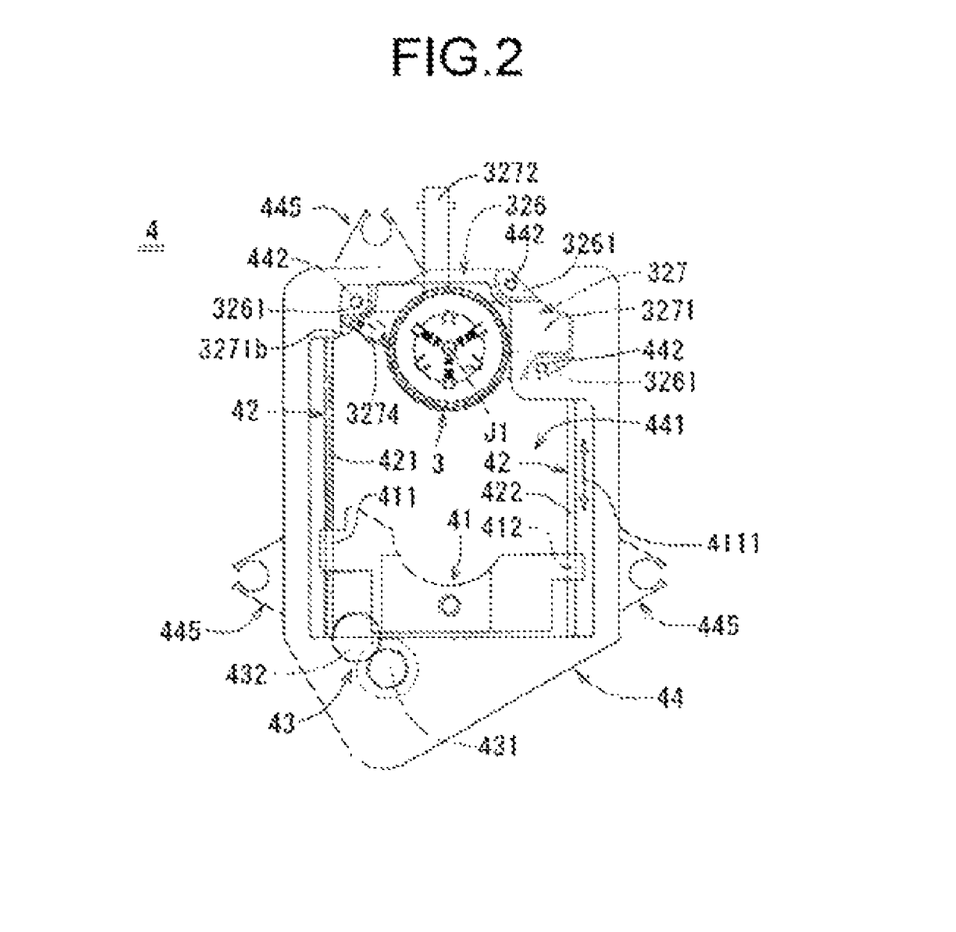
FIG. 2 is a top plan view showing a traverse unit in accordance with the present invention.
Figure 3:
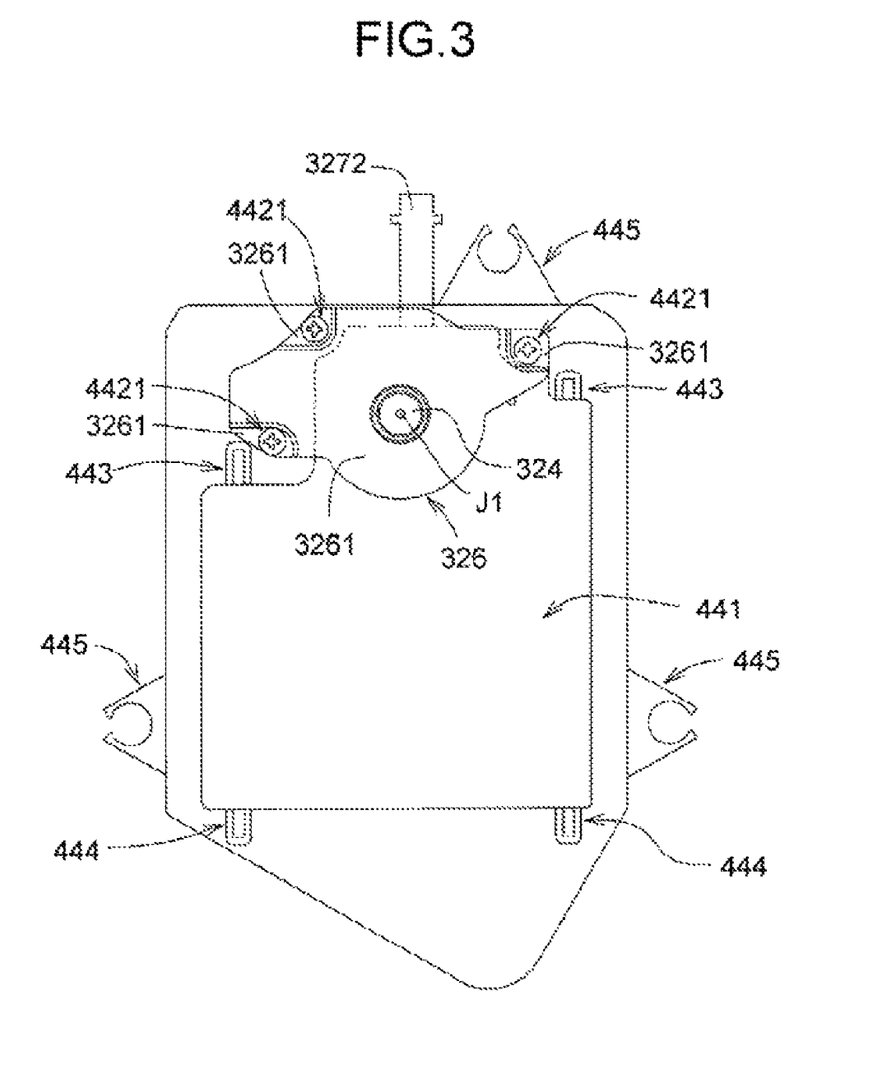
FIG. 3 is a bottom plan view showing a state in which a motor is attached to a chassis in accordance with the present invention.

Next, the configuration of one example of the traverse unit 4 in accordance with the present invention will be described with reference to FIGS. 2 and 3. FIG. 2 is a top plan view showing the traverse unit 4. FIG. 3 is a bottom plan view showing a state in which the motor 3 is attached to the chassis 44 of the traverse unit 4.

Referring to FIG. 2, the traverse unit 4 preferably includes the below-described component parts, namely the motor 3, the guide rails 42, the optical pickup unit 41 and the moving mechanism 43. The motor 3 is attached to a portion of the chassis 44 having a substantially flat shape. The guide rails 42 are arranged on the chassis 44 to guide the optical pick up unit 41 to move in the radial direction. The optical pickup unit 41 is arranged on the guide rails 42 for movement along the guide rails 42. The moving mechanism 43 causes the optical pickup unit 41 to move in the radial direction.

The chassis 44 has an accommodation opening 441 formed to accommodate the optical pickup unit 41. Within the accommodation opening 441, the optical pickup unit 41 is movable in the radial direction (in the direction indicated by an arrow 4111 in FIG. 2).

In the portion of the chassis 44 around the accommodation opening 441, there is formed a plurality of chassis-side attachment holes 442 through which to attach a below-mentioned attachment plate 326 of the motor 3 (see FIG. 4) to the chassis 44. Although the number of the chassis-side attachment holes 442 is three in this preferred embodiment, the present invention is not limited thereto.

The motor 3 is fixed to the chassis 44 by fastening screws 4421 (see FIG. 3) into the chassis-side attachment holes 442 from the lower surface of the chassis 44.

In the outer peripheral, edge of the chassis 44, there is arranged housing attachment portions 445 to which the housing 5 is attached through dampers. The number of the housing attachment portions 445 is three in this preferred embodiment. The dampers refer to anti-vibration members made of a highly elastic material, e.g., rubber.

The attachment plate 326 includes a plurality of flat motor attachment portions 3261 (see FIG. 5) attached to the chassis-side attachment holes 442 of the chassis 44.

Referring to FIG. 3, first guide rail attachment portions 443 arranged to fix the guide rails 42 in place are formed on the lower surface of the chassis 44. Second guide rail attachment portions 444 are formed at the opposite side of the accommodation opening 441 from the chassis-side attachment holes 442. Using the first and second guide rail attachment portions 443 and 444, the guide rails 42 are arranged parallel to each other.

Referring again to FIG. 2, the optical pickup unit 41 has through-holes 411 and 412 formed in a corresponding relationship with the guide rails 42, the through-holes 411 and 412 extending in the extension direction of the respective guide rails 42. The guide rails 42 are inserted into the through-holes 411 and 412, thereby fixing the axial position of the optical pickup unit 41.

One of the guide rails 42 is a feeding shaft 421 having an external thread portion. The other is a sliding shaft 422 that makes sliding movement with respect to the through-hole 412. The through-hole 411 of the optical pickup unit 41, into which the feeding shaft 421 is inserted, has an internal thread portion engaging with the external thread portion of the feeding shaft 421.

The moving mechanism 43 includes a driving motor 431 as a rotational power source, which has an output shaft provided with a driving gear, and a reduction gear 432 meshing with the driving gear of the driving motor 431. The reduction gear 432 makes the revolution number of the feeding shaft 421 smaller than that of the driving motor 431.

Rotation of the driving motor 431 causes the driving gear of the output shaft to rotate together with the reduction gear 432. This leads to rotation of the feeding shaft 421 meshing with the reduction gear 432. Rotation of the feeding shaft 421 inserted into the through-hole 411 causes the optical pickup unit 41 to move in the direction indicated by the arrow 4111 in FIG. 2.

Figure 4:
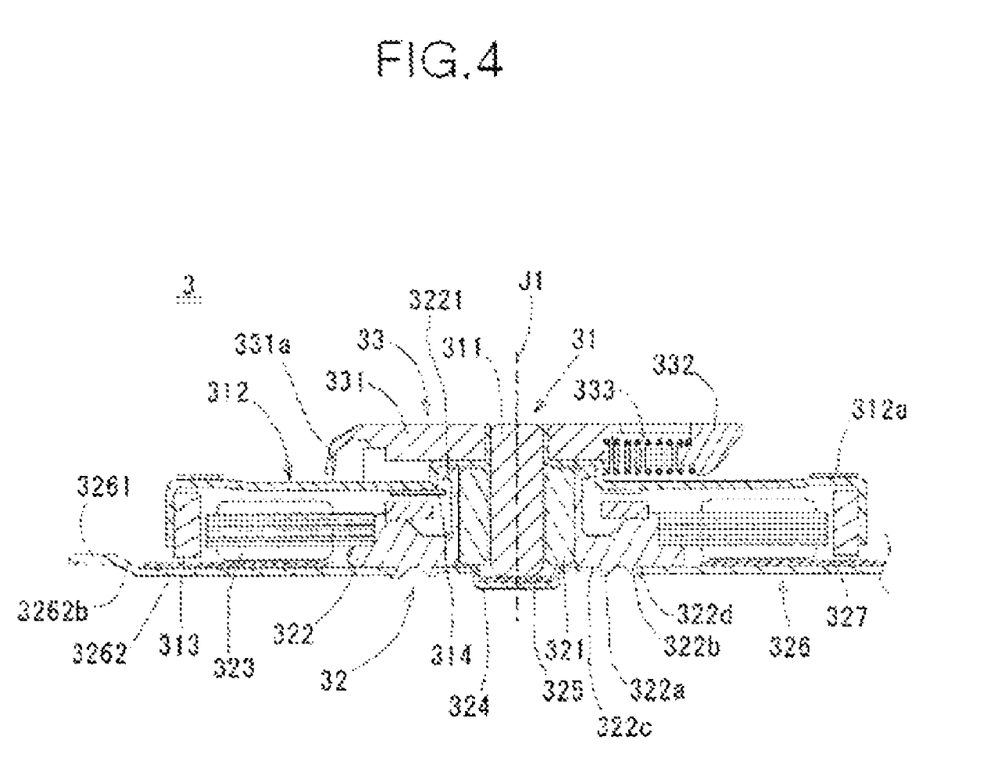
FIG. 4 is a section view showing a motor in accordance with one preferred embodiment of the present invention, which view is taken along a plane containing a central axis.
Figure 5:
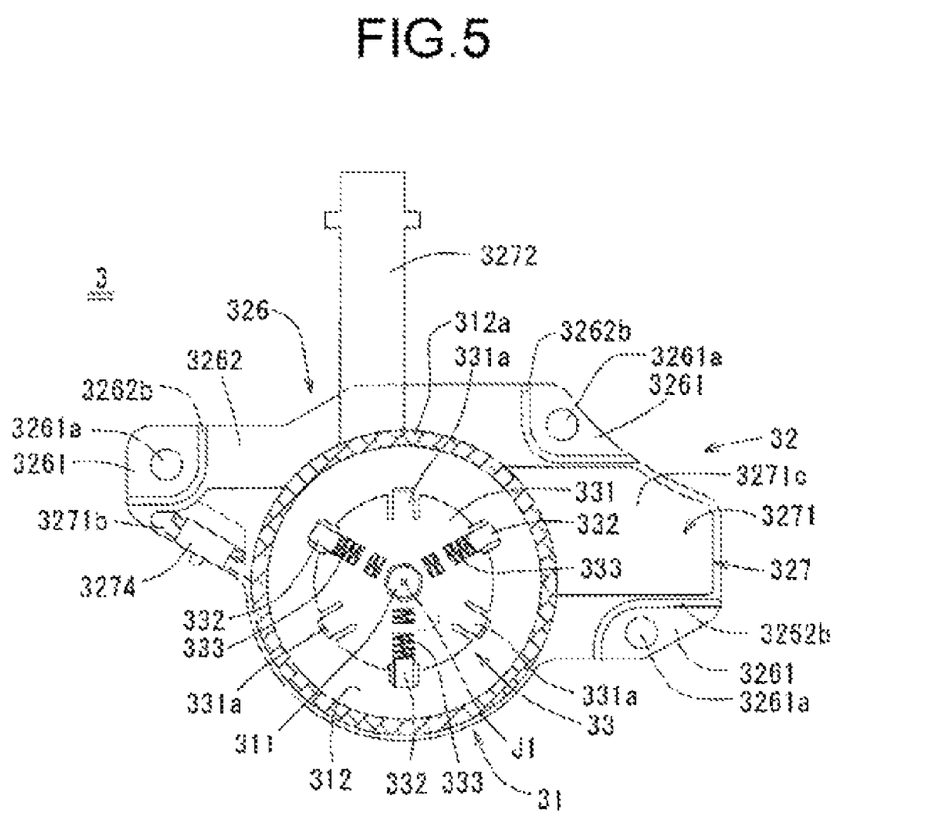
FIG. 5 is a top plan view showing the motor.

Next, the motor 3 in accordance with one preferred embodiment of the present invention will be described with reference to FIGS. 4 and 5. FIG. 4 is a section view of the present motor 3 taken along a plane containing the central axis J1. FIG. 5 is a top plan view of the present motor 3.

Referring to FIGS. 4 and 5, the motor 3 preferably includes a rotor unit 31 rotatable about the central axis J1, a stator unit 32 arranged to rotatably support the rotor unit 31 and a chucking unit 33 rotatable together with the rotor unit 31 and capable of holding the disk 2 (see FIG. 1) in place.

The rotor unit 31 preferably includes a shaft 311 substantially coaxial with the central axis J1, a rotor holder 312 fixed to the shaft 311, a rotor magnet 313 fixed to the rotor holder 312 and a removal-preventing member 314 fixed to the lower surface of the rotor holder 312. The rotor holder 312 is formed by pressing a steel sheet.

The stator unit 32 preferably includes a substantially cylindrical sleeve 321, a stator housing 322, a stator 323, a seal member 324, a thrust plate 325, a substantially flat attachment plate 326 and a circuit board 327.

The sleeve 321 is formed from a porous sintered body impregnated with oil. The stator housing 322 has an inner circumferential surface arranged to hold the outer circumferential surface of the sleeve 321 in place. The stator 323 is fixed to the stator housing 322 so as to generate a magnetic field between itself and the rotor magnet 313.

The seal member 324 seals off the lower side of the stator housing 322. The thrust plate 325 is arranged on the upper surface of the seal member 324 so as to rotatably support the shaft 311 in the axial direction. The circuit board 327 is arranged radially outwards of the seal member 324 and is fixed to the lower side of the stator housing 322. The attachment plate 326 is fixed to the chassis 44. The circuit board 327 is attached to the upper surface of the attachment plate 326.

In the motor attachment portions 3261 (see FIG. 5) of the attachment plate 326 attached to the chassis-side attachment holes 422 (see FIG. 2) of the chassis 44, there are formed motor-side attachment holes 3261a (see FIG. 5).

A flange portion 3221 is formed in the upper end portion of the stator housing 322. Arranged below the flange portion 3221 is the removal-preventing member 314 having an inner diameter smaller than the outer diameter of the flange portion 3221. This makes it possible to prevent the rotor unit 31 from moving axially upwards relative to the stator unit 32.

On the lower end surface of the stator housing 322, there are provided an inner protrusion 322a arranged to fix the seal member 324 in place and an outer protrusion 322b formed radially outwards of the inner protrusion 322a to fix the attachment plate 326 in place.

Each of the inner protrusion 322a and the outer protrusion 322b has a substantially annular shape and extends axially downwards. An inner contact surface 322c with which the upper surface of the seal member 324 makes contact to set the axial position of the seal member 324 is formed radially inwards of the inner protrusion 322a.

An outer contact surface 322d by which to set the axial position of the attachment plate 326 is formed radially outwards of the outer protrusion 322b. Each of the inner contact surface 322c and the outer contact surface 322d is formed of a substantially ring-shaped planar surface extending perpendicularly to the central axis J1.

The outer protrusion 322b is plastically deformed radially outwards in a state that the attachment plate 326 makes contact with the outer contact surface 322d. Thus the attachment plate 326 is interposed between the outer contact surface 322d and the outer protrusion 322b, as a result of which the attachment plate 326 is fixed to the lower end surface of the stator housing 322. In other words, the attachment plate 326 is fixed to the stator housing 322 by caulking.

Similarly, the inner protrusion 322a is plastically deformed radially inwards in a state that the seal member 324 makes contact with the inner contact surface 322c. The seal member 324 is interposed between the inner contact surface 322c and the inner protrusion 322a, as a result of which the seal member 324 is fixed to the lower end surface of the stator housing 322. In other words, the seal member 324 is fixed to the stator housing 322 by caulking.

Therefore, the attachment plate 326 and the seal member 324 are fixed to the stator housing 322 in a cost-effective manner without having to use any additional fixing member. This makes it possible to provide a low-priced motor.

The chucking unit 33 preferably includes a center case 331, centering claws 331a, radially movable claw members 332 and resilient members 333. The center case 331 is positioned radially inwards of the mounting aperture 21 (see FIG. 1) of the disk 2 in a radially opposing relationship with the inner circumferential surface of the mounting aperture 21. The centering claws 331a are provided as a single piece with the center case 331. The centering claws 331a press the inner circumferential surface of the mounting aperture 21 radially outwards, thereby bringing the center of the mounting aperture 21 into alignment with the center of the center case 331.

The claw members 332 press the upper surface of the disk 2 around the mounting aperture 21, thereby holding the disk 2 in position. The resilient members 333 bias the claw members 332 radially outwards.

The centering claws 331a are three in number and are provided in a circumferentially spaced-apart relationship with one another. In this preferred embodiment, each of the claw members 332 is arranged between the circumferentially adjoining centering claws 331a. The claw members 332 are three in number. In this preferred embodiment, the resilient members 333 include, e.g., coil springs that can be compressed and expanded in the radial direction.

A disk mounting surface 312a on which the lower surface of the disk 2 lies is formed on the upper surface of the rotor holder 312. An annular resin body made of, e.g., rubber, is arranged on the disk support surface 312a. The resin body exhibits a frictional coefficient greater than that of the upper surface of the rotor holder 312. Formation of the disk mounting surface 312a on the upper surface of the rotor holder 312 eliminates the need to additionally provide a disk supporting turntable. This makes it possible to reduce the number of component parts and to reduce the axial thickness of the motor 3.

The rotor holder 312 is formed by pressing a sheet material, which makes it possible to cost-effectively produce the rotor holder 312. This also makes it possible to reduce the overall thickness of the motor 3 as compared to a case where the rotor holder would be made of a resin or produced by die-casting.

Figure 6A:
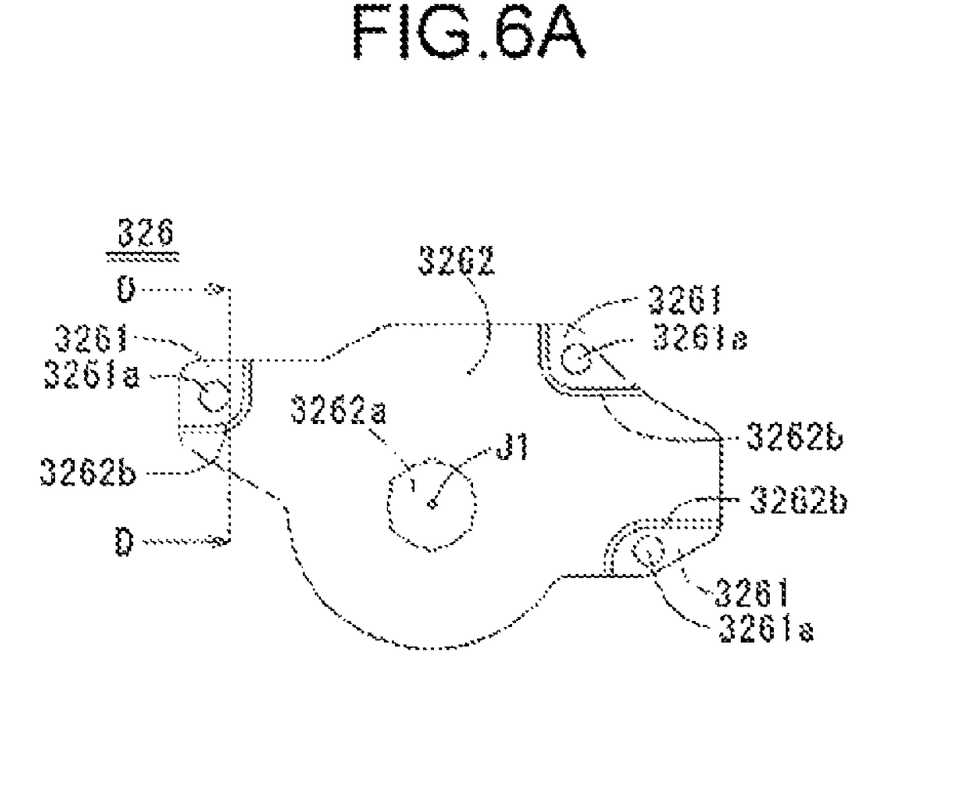
FIG. 6A is a top plan view showing an attachment plate in accordance with the present invention and FIG. 6B is a section view axially taken along line D-D in FIG. 6A.
Figure 6B:
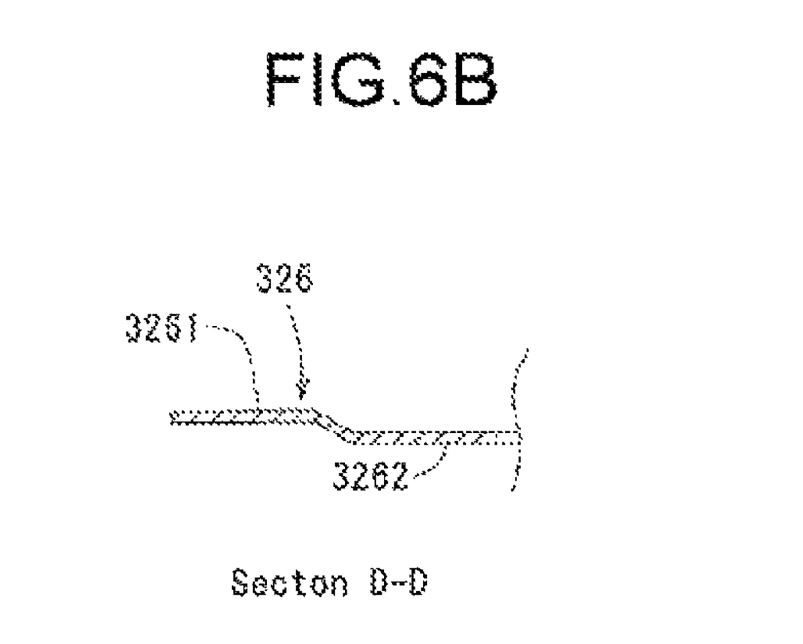
Figure 7A:
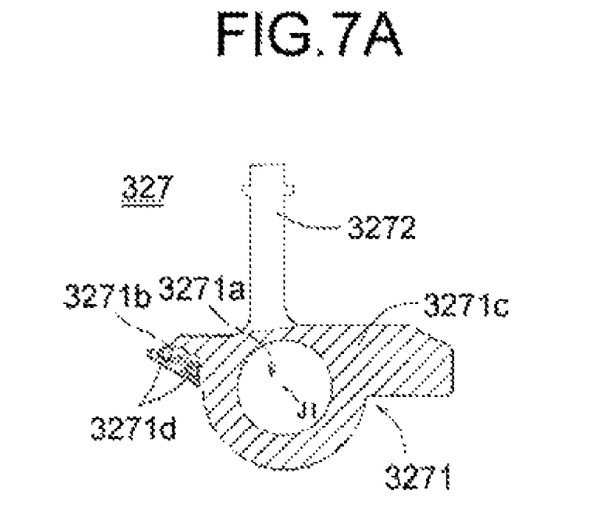
FIG. 7A is a top plan view showing one example of a circuit board in accordance with the present invention, FIG. 7B being a bottom plan view showing the circuit board and FIG. 7C being a section view axially taken along line C-C in FIG. 7B.

Next, the structures of the attachment plate 326 and the circuit board 327 will be described with reference to FIGS. 6A through 8C. FIG. 6A is a top plan view showing the attachment plate 326 in accordance with the present embodiment and FIG. 6B is a section view axially taken along line D-D in FIG. 6A. FIG. 7A is a top plan view showing the circuit board 327 in accordance with the present embodiment, FIG. 7B being a bottom plan view of the circuit board 327 and FIG. 7C being a section view axially taken along line C-C in FIG. 7B. FIG. 8A is a top plan view showing the circuit board 327 attached to the attachment plate 326, FIG. 8B being a section view axially taken along line A-A in FIG. 8A and FIG. 8C being a section view axially taken along line B-B in FIG. 8A.

Referring to FIGS. 6A and 6B, the attachment plate 326 is formed by pressing a metal sheet, preferably a stainless steel sheet.

The attachment plate 326 preferably includes a plurality of motor attachment portions 3261 and a base portion 3262 to which the motor attachment portions 3261 are joined. The attachment plate 326 is formed of a single member. Since the attachment plate 326 is formed by pressing a metal sheet, it is possible to reduce the axial thickness of the attachment plate 326 as compared to a case where the attachment plate would be made of a resin or produced by die-casting. This makes it possible to reduce the axial size of the motor 3.

The base portion 3262 preferably includes a central through-hole 3262a and a plurality of joint portions 3262b. The central through-hole 3262a is a substantially circular through-hole coaxial with the central axis J1. The motor attachment portions 3261 are respectively joined to the joint portions 3262b. The joint portions 3262b are provided along the outer peripheral edge of the base portion 3262. The stator housing 322 (see FIG. 4) is inserted into the central through-hole 3262a.

The motor attachment portions 3261 include motor-side attachment holes 3261a through which the screws 4421 (see FIG. 3) are inserted. The upper surfaces of the motor attachment portions 3261 are positioned higher than the upper surface of the base portion 3262. The lower surfaces of the motor attachment portions 3261 are positioned higher than the lower surface of the base portion 3262. This means that the joint portions 3262b are inclined axially upwards from the base portion 3262 toward the motor attachment portions 3261. The motor attachment portions 3261 are respectively provided radially outward than the rotor holder 312 of the rotor unit 31 (see FIG. 5).

Figure 7B:
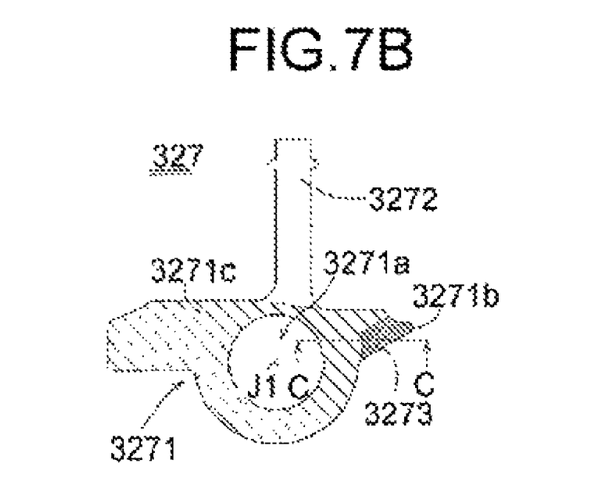
Figure 7C:
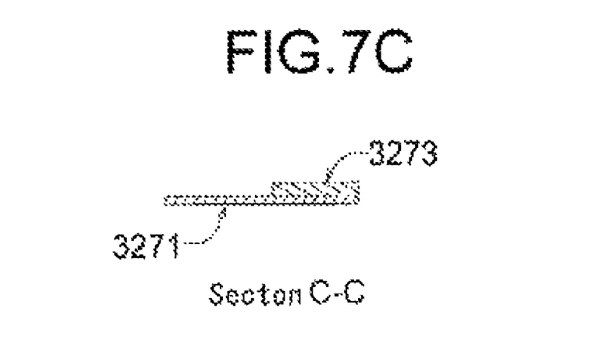
Figure 8A:
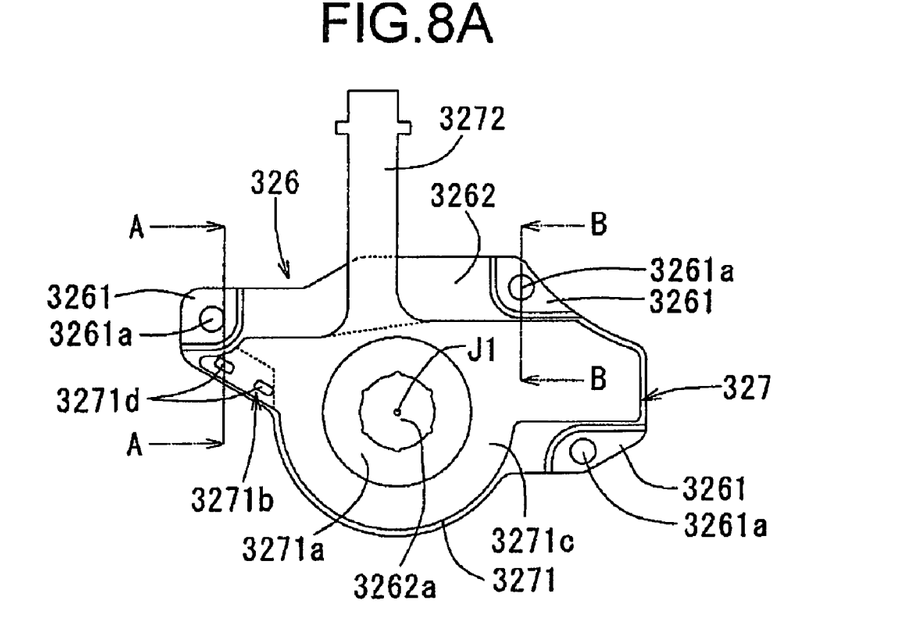
FIG. 8A is a top plan view showing the circuit board attached to the attachment plate, FIG. 8B being a section view axially taken along line A-A in FIG. 8A and FIG. 8C being a section view axially taken along line B-B in FIG. 8A.

Referring to FIGS. 7A through 7C, the circuit board 327 is a flexible printed circuit board made of a resin material such as polyimide or the like. The circuit board 327 preferably includes a body portion 3271 and an electric connection portion 3272.

The body portion 3271 is attached to the base portion 3262 (see FIG. 6A) of the attachment plate 326. The electric connection portion 3272 extends from the body portion 3271 beyond the outer periphery of the attachment plate 326 (see FIG. 5) and is electrically connected to another circuit board (not shown). The body portion 3271 and the electric connection portion 3272 of the circuit board 327 are formed into a single member.

The body portion 3271 preferably includes a first area 3271b to which electronic parts (not shown in FIGS. 7A to 7C) are mounted and a second area 3271c provided with an opening 3271a. The opening 3271a is formed of substantially circular through-hole coaxial with the central axis J1.

A flat planar member 3273 made of a resin material is attached to the lower surface of the first area 3271b. In this preferred embodiment, the planar member 3273 is a projection portion protruding from the lower surface of the first area 3271b. Land portions 3271d are provided in the first area 3271b through preliminary soldering.

Figure 8B:
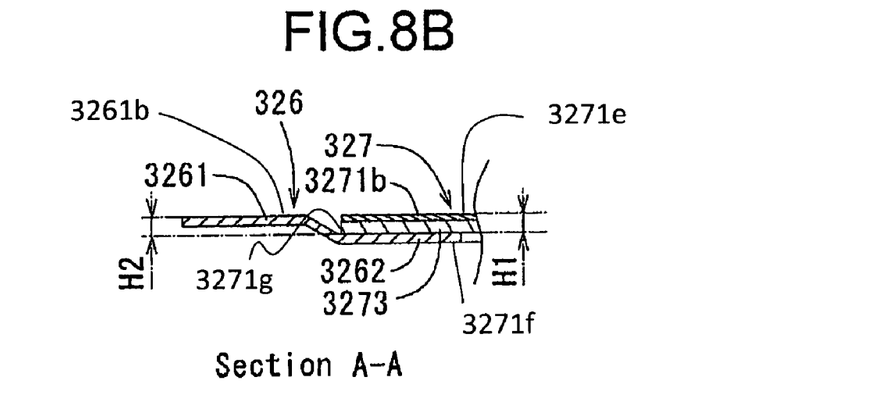
Figure 8C:
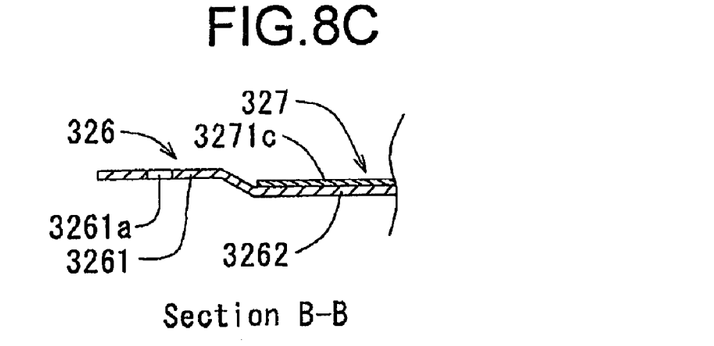

Referring to FIGS. 8A through 8C, the upper surface of the second area 3271c of the base portion 3262 is positioned lower than the upper surfaces of the motor attachment portions 3261. The height H1 from the upper surface of the base portion 3262 of the attachment plate 326 to the upper surface of the first area 3271b is substantially equal to the height H2 from the upper surface of the base portion 3262 to the upper surfaces of the motor attachment portions 3261 of the attachment plate 326. The body portion 3271 has an upper surface 3271e and a lower surface 3271f with an outer periphery 3271g. As described in FIG. 8B, the outer periphery 3271g of the lower surface 3271f of the body portion 3271 is lower than the upper surfaces 3261b of the motor attachment portions 3261.

Next, a method for preliminarily performing soldering on the circuit board 327 prior to bonding electronic parts thereto will be described with reference to FIGS. 9A through 9C. Hereinafter, the method for preliminarily performing soldering will be referred to as "preliminary soldering".

Figure 9A:
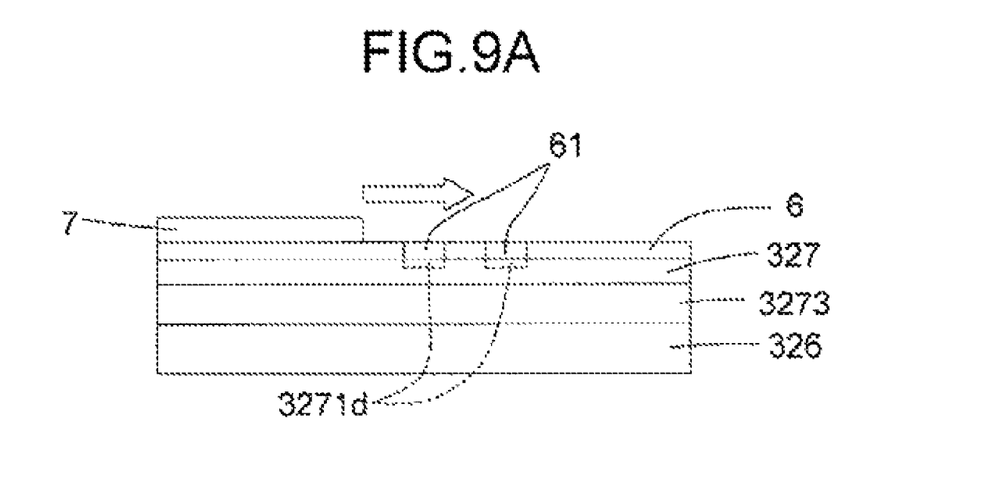
FIGS. 9A through 9B illustrate a method for preliminarily performing soldering on the circuit board, FIG. 9A depicting a state prior to applying solder on land portions, FIG. 9B depicting a state in which the solder is applied on the land portions and FIG. 9C depicting a state in which the solder is applied on the land portions, with a metal mask removed.
Figure 9B:
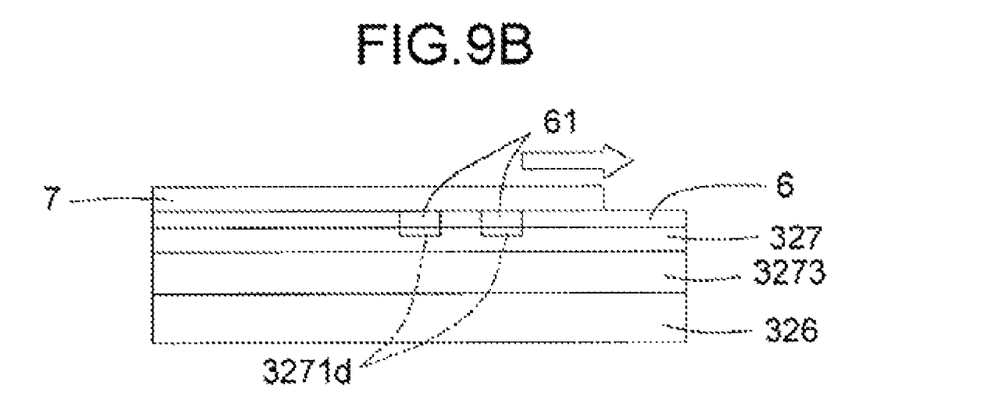
Figure 9C:
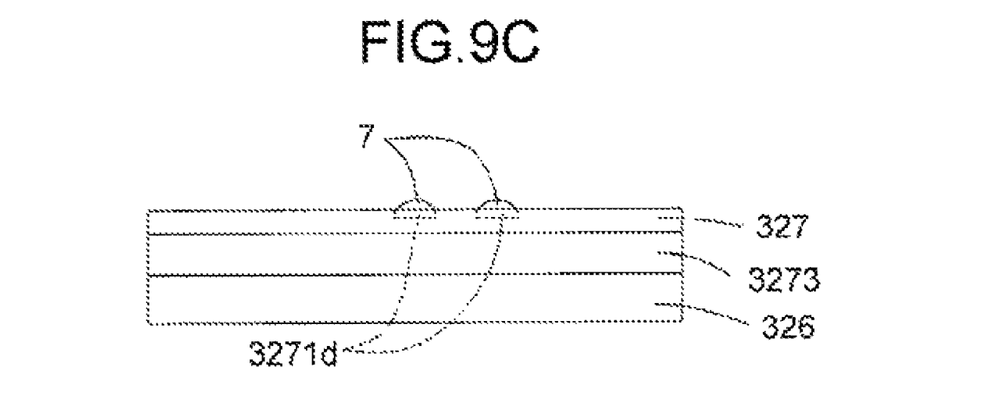

FIGS. 9A through 9C illustrate the method for performing preliminary soldering on the circuit board 327. FIG. 9A depicts a state prior to applying solder 7 on the land portions 3271d. FIG. 9B depicts a state in which the solder 7 is applied on the land portions 3271d. FIG. 9C depicts a state in which the solder 7 is applied on the land portions 3271d, with a metal mask 6 removed.

Preliminary soldering is performed on the land portions 3271d in order to bond electronic parts to the first area 3271b of the circuit board 327. The preliminary soldering is carried out in a state that the circuit board 327 is attached to the attachment plate 326. This makes it possible to accurately set the position of the circuit board 327 relative to the attachment plate 326. Therefore, it is possible to enhance the accuracy with which the electronic parts bonded to the circuit board 327 are positioned relative to the attachment plate 326.

Referring to FIGS. 9A through 9C, a metal mask 6 is arranged to make contact with the upper surface of the first area 3271b of the circuit board 327 when performing the preliminary soldering. The metal mask 6 is formed of a stainless steel sheet. The metal mask 6 has through-holes 61 positioned in alignment with the land portions 3271d of the first area 3271b of the circuit board 327.

Cream-like solder 7 is applied on the upper surface of the metal mask 6. The solder 7 is filled into the through-holes 61 of the metal mask 6 and is applied on the land portions 3271d. Then the attachment plate 326 is placed within a reflow furnace as a constant temperature furnace (not shown), thereby performing the preliminary soldering. Use of the metal mash 6 makes it possible to simultaneously perform the preliminary soldering on the respective land portions 3271d of a plurality of circuit boards 327. Therefore, it is possible to increase the motor production efficiency as compared to a case where the solder is manually applied on the land portions 3271d.

If the upper surface of the first area to which electronic parts are bonded is positioned axially lower than the upper surfaces of the motor attachment portions as in the conventional case, the metal mask would come into contact with motor attachment portions. This would create an axial gap between the upper surface of the first area and the lower surface of the metal mask.

As a result, the solder flowing into the through-holes of the metal mask would be filled in the axial gap between the upper surface of the first area and the lower surface of the metal mask. This would make it impossible to perform the preliminary soldering only on the land portions of the first area. For that reason, it has been conventionally difficult to perform the preliminary soldering with the metal mask.

With the circuit board 327 of the present embodiment, the planar member 3273 is attached to the lower surface of the first area 3271b to make the height H1 substantially equal to the height H2 as set forth above. This ensures that the lower surface of the metal mask 6 makes contact with the upper surface of the first area 3271b. Thanks to this feature, no or little axial gap is created between the upper surface of the first area 3271b and the lower surface of the metal mask 6.

As a result, it is possible to apply the solder 7 on the land portions 3271d of the first area 3271b through the through-holes 61 of the metal mask 6. This makes it possible for a solder applicator to simultaneously perform the preliminary soldering on a plurality of circuit boards 327 in an automated fashion, consequently increasing the motor production efficiency.

The height of the upper surface of the circuit board 327 in the first area 3271b may be adjusted by changing the axial thickness of the planar member 3273.

Next, the position of the first area 3271b of the circuit board 327 will be described with reference to FIGS. 1, 2 and 5.

Referring to FIGS. 2 and 5, the first area 3271b of the circuit board 327 is positioned radially outwards of the rotor unit 31. A switch 3274 is mounted to the first area 3271b. The switch 3274 serves to stop movement of the optical pickup unit 41 toward the motor 3. In other words, when making contact with the switch 3274, the optical pickup unit 41 is prevented from further moving toward the motor 3.

The switch 3274 generates a signal which in turn is transmitted to a driving device side circuit board (not shown) of the disk drive apparatus 1 via the electric connection portion 3272 of the circuit board 327. The need to have the driving device side circuit board extend up to the switch 3274 may be eliminated by attaching the switch 3274 to the circuit board 327 of the motor 3. This makes it possible to simplify the driving device side circuit board without having to arrange the same in a complex pattern.

The switch 3274 transmits a signal by making contact with the optical pickup unit 41. Therefore, the switch 3274 needs to be arranged in a position where it can make contact with the optical pickup unit 41. This means that restriction is imposed on the arrangement position of the switch 3274. Since the circuit board 327 of the motor 3 is arranged near the switch 3274, the switch 3274 belongs to the circuit board 327. This makes it possible to efficiently arrange the driving device side circuit board of the disk drive apparatus 1.

Referring again to FIGS. 1, 2 and 10, the second area 3271c of the circuit board 327 has a portion lying radially inwards of the rotor unit 31. As set forth earlier, the first area 3271b is provided radially outwards of the rotor unit 31. In other words, the circuit board 327 axially opposes the rotor unit 31 in the second area 3271c. Therefore, the stator 323, the rotor holder 312 and the rotor magnet 313 can be positioned near the upper surface of the second area 3271c regardless of the first area 3271b. As a result, it is possible to reduce the axial thickness of the motor 3.

Figure 10:
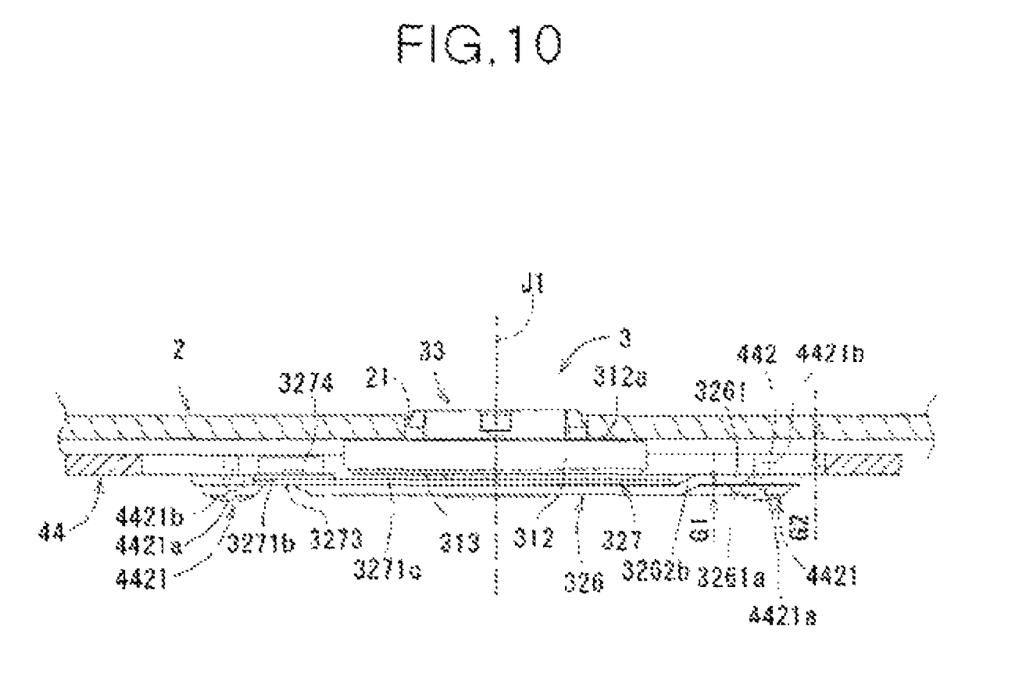
FIG. 10 is a side section view illustrating a state in which the motor is attached to the chassis.

Next, the state in which the motor 3 is attached to the chassis 44 will be described with reference to FIG. 10, which is a side section view illustrating the state in which the motor 3 is attached to the chassis 44.

The motor attachment portions 3261 of the attachment plate 326 are positioned axially higher than the base portion 3262. The upper surfaces of the motor attachment portions 3261 make contact with the upper surface of the chassis 44. Screws 4421 are driven into the motor-side attachment holes 3261a of the motor attachment portions 3261 and the chassis-side attachment holes 422 of the chassis 44.

More specifically, each of the screws 4421 includes a fixing portion 4421b extending in the axial direction and a screw head 4421a making contact with the lower surface of each of the motor attachment portions 3261. The fixing portion 4421b is threadedly coupled with the motor-side attachment holes 3261a and is fastened to the chassis-side attachment holes 422.

Inasmuch as the motor attachment portions 3261 are formed higher than the base portion 3262, the screw head 4421a is accommodated within an axial gap G1 between the lower surface of each of the motor attachment portions 3261 and the lower surface of the base portion 3262. This makes it possible to prevent the screw head 4421a from protruding axially downwards beyond the lower surface of the base portion 3262.

The base portion 3262 is arranged lower than the lower surface of the chassis 44. This makes it possible to reduce the axial gap G2 between the upper surface of the chassis 44 and the disk support surface 312a provided on the upper surface of the rotor holder 312. In other words, it becomes possible to keep the lower surface of the disk 2 and the upper surface of the chassis 44 adjacent to each other in the axial direction. Therefore, it is possible to reduce the axial size of the traverse unit 4, consequently reducing the overall thickness of the disk drive apparatus 1.

According to the present invention, the height of the upper surface of the circuit board 327 in the first area 3271b is set substantially equal to or greater than the height of the upper surfaces of the motor attachment portions 3261. This configuration enables the solder applicator to automatically perform the preliminary soldering, which eliminates the need to manually carry out the preliminary soldering. Therefore, it is possible to automate the manufacturing process of the motor 3, while increasing the production efficiency of the motor 3.

The height of the upper surface of the circuit board 327 in the second area 3271c is set smaller than the height of the upper surfaces of the motor attachment portions 3261. This makes it possible to reduce the height of the motor 3 protruding upwards relative to the motor attachment portions 3261. Therefore, it becomes possible to reduce the overall thickness of the motor 3.

Owing to the fact that the planar member 3263 is arranged below the first area 3271b, it becomes easy to adjust the height of the first area 3271b relative to the base portion 3262.

The circuit board 327 is formed of a flexible printed circuit board and the attachment plate 326 is formed by pressing a metal sheet. This makes it possible to reduce the overall thickness of the motor 3 as compared to a case where the circuit board is formed of a rigid printed circuit board or a case where the attachment plate is produced by die-casting or formed by molding a resin.

The first area 3271b is provided radially outwards of the rotor unit 31 and at least a portion of the second area 3271c is arranged radially inwards of the rotor unit 31. This makes it possible to arrange the rotor unit 31 in a relatively low position without affecting the first area 3271b. Therefore, it becomes possible to reduce the overall thickness of the motor 3.

The reduction in the overall thickness of the motor 3 makes it possible to reduce the overall thickness of the disk drive apparatus 1.

Since the switch 3274 is mounted to the circuit board 327 of the motor 3, there is no need to have the driving device side circuit board extend up to the switch 3274. This makes it possible to simplify the driving device side circuit board without having to arrange the same in a complex pattern.

While one preferred embodiment of the present motor has been described hereinabove, the present invention is not limited thereto but may be modified in many different forms without departing from the scope thereof.

Although the height H1 is substantially equal to the height H2 according to the preferred embodiment described above, the present invention is not limited thereto. As an alternative example, the height H1 from the upper surface of the base portion of the attachment plate to the upper surface of the first area 3271b may be set greater than the height H2 from the upper surface of the base portion to the upper surfaces of the motor attachment portions of the attachment plate.

Although the planar member 3273 is attached to the first area 3271b according to the preferred embodiment described above, the present invention is not limited thereto. As an alternative example, the region of the base portion of the attachment plate corresponding to the first area of the circuit board may be bent upwards to form a raised portion. The raised portion may be used in place of the planar member. In this case, the raised portion serves as the projection portion of the present invention.

What is claimed is:

1. A brushless motor rotatable about a central axis, comprising:
 a substantially flat attachment plate including a plurality of motor attachment portions and a base portion arranged to interconnect the motor attachment portions; and
 a circuit board arranged on the base portion, the circuit board comprising a body portion and an electric connection portion, the body portion having an upper surface and a lower surface with an outer periphery, the body portion being attached to the attachment plate, the electric connection portion extending outside the attachment plate, the body portion of the circuit board including a first area to which electronic parts are attached, wherein
 upper surfaces of the motor attachment portions are arranged higher than an upper surface of the base portion, the height of an upper surface of the circuit board in the first area being substantially equal to or greater than the height of the upper surfaces of the motor attachment portions, the outer periphery of the lower surface of the body portion being lower than the upper surfaces of the motor attachment portions.

2. The brushless motor of claim 1, wherein the circuit board including a second area, the height of the upper surface of the circuit board in the second area being smaller than the height of the upper surfaces of the motor attachment portions.

3. The brushless motor of claim 1, wherein a projection portion arranged to adjust the height of the upper surface of the circuit board in the first area is provided between the first area of the circuit board and the base portion opposing the first area of the circuit board.

4. The brushless motor of claim 3, wherein the projection portion comprises a flat planar member.

5. The brushless motor of claim 3, wherein the projection portion comprises a raised portion formed by upwardly bending a portion of the base portion opposing the first area of the circuit board.

6. The brushless motor of claim 1, wherein the circuit board comprises a flexible printed circuit board, and the attachment plate comprises a press-formed metal sheet.

7. The brushless motor of claim 1, further comprising:
a housing including a cylindrical portion with a specified center;
a sleeve arranged inside the cylindrical portion;
a rotor unit rotatably supported by the sleeve, the rotor unit including a shaft inserted into the sleeve; and
a chucking unit arranged to removably hold a disk.

8. The brushless motor of claim 7, wherein the first area is arranged radially outwards of the rotor unit, and at least a portion of the second area is arranged radially inwards of the rotor unit.

9. A disk drive apparatus provided with a disk, comprising:
the brushless motor of claim 1;
an optical pickup unit arranged to emit and receive light to and from the disk; and
a moving mechanism arranged to move the optical pickup unit in a radial direction.

10. The disk drive apparatus of claim 9, further comprising a switch attached to the first area of the circuit board and arranged to restrain radial movement of the optical pickup unit.

* * * * *